(12) United States Patent
Onishi (10) Patent No.: US 10,766,056 B2
(45) Date of Patent: Sep. 8, 2020

(54) PURGE DEVICE, PURGE STOCKER, AND METHOD FOR FEEDING PURGE GAS

(71) Applicant: MURATA MACHINERY, LTD., Kyoto-shi, Kyoto (JP)

(72) Inventor: Shinji Onishi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 122 days.

(21) Appl. No.: 15/749,803

(22) PCT Filed: Jun. 9, 2016

(86) PCT No.: PCT/JP2016/067203
§ 371 (c)(1),
(2) Date: Feb. 2, 2018

(87) PCT Pub. No.: WO2017/022330
PCT Pub. Date: Feb. 9, 2017

(65) Prior Publication Data
US 2018/0229277 A1    Aug. 16, 2018

(30) Foreign Application Priority Data

Aug. 4, 2015 (JP) .................................. 2015-153757

(51) Int. Cl.
*B08B 9/28* (2006.01)
*H01L 21/677* (2006.01)
(Continued)

(52) U.S. Cl.
CPC ................ *B08B 5/023* (2013.01); *B08B 5/02* (2013.01); *B08B 9/0826* (2013.01); *B08B 9/283* (2013.01); *B08B 9/34* (2013.01); *F16K 21/00* (2013.01); *H01L 21/67393* (2013.01); *H01L 21/67769* (2013.01)

(58) Field of Classification Search
CPC ......... B08B 5/023; B08B 5/02; B08B 9/0826; B08B 9/34; B08B 9/283; H01L 21/67393; H01L 21/67769
See application file for complete search history.

(56) References Cited

U.S. PATENT DOCUMENTS

| 2008/0156069 | A1* | 7/2008 | Murata ................. G01F 15/063 73/19.04 |
| 2014/0000757 | A1* | 1/2014 | Takahara .......... H01L 21/67769 141/8 |
| 2014/0009045 | A1  | 1/2014 | Otsuka et al. |

FOREIGN PATENT DOCUMENTS

| JP | 11-314703 A   | 11/1999 |
| JP | 2005-340330 A | 12/2005 |

(Continued)

OTHER PUBLICATIONS

Official Communication issued in International Patent Application No. PCT/JP2016/067203, dated Aug. 23, 2016.

*Primary Examiner* — Craig M Schneider
*Assistant Examiner* — Jason K Niesz
(74) *Attorney, Agent, or Firm* — Keating & Bennett, LLP (57) ABSTRACT

A purge device includes: a plurality of mounts on which containers are to be placed and that are grouped, a nozzle that is structured such that when a container is placed on the corresponding mount, a flow path to supply a purge gas to the container is opened, and a flow rate controller that adjusts a flow rate of the purge gas supplied into a group based on a number of containers in the group.

3 Claims, 11 Drawing Sheets

(51) Int. Cl.
  *B08B 5/02*  (2006.01)
  *B08B 9/34*  (2006.01)
  *B08B 9/08*  (2006.01)
  *H01L 21/673*  (2006.01)
  *F16K 21/00*  (2006.01)

(56) References Cited

FOREIGN PATENT DOCUMENTS

| | | |
|---|---|---|
| JP | 2010-182747 A | 8/2010 |
| JP | 4670808 B2 | 4/2011 |
| JP | 2015-065259 A | 4/2015 |
| JP | 2015-142104 A | 8/2015 |

* cited by examiner

PURGE DEVICE, PURGE STOCKER, AND METHOD FOR FEEDING PURGE GAS

BACKGROUND OF THE INVENTION

1. Field of the Invention

The present invention relates to a purge device, a purge stocker, and a method for feeding a purge gas.

2. Description of the Related Art

For storage of containers such as FOUP, SMIF Pod, and reticle Pod for containing wafers and reticles therein, a purge gas such as clean dry air or nitrogen gas is filled in the container by a purge device to suppress contamination and oxidation of contained matters. It is known that the purge device is provided to a purge stocker for storing containers therein. If abnormal purging such as insufficient supply of purge gas by the purge device occurs, contained matters are contaminated. Thus, a technique for measuring the flow rate of purge gas supplied to a container to detect abnormal purging has been developed (see, for example, Japanese Patent No. 4670808). In Japanese Patent No. 4670808, the flow rate or the pressure of purge gas supplied to the inside of a container placed on a mount is measured by a sensor to determine whether satisfactory purging has been performed. In such a purge device, an electromagnetic valve or a flow rate controller is disposed for each mount to adjust the flow rate of purge gas for the container.

The configuration in which an electromagnetic valve or a flow rate controller is disposed for each mount, however, requires a space for disposing these devices, with the result that each purge device is complicated and increased in size. In recent years, the purge stocker has been required to be downsized while the number of containers that are able to be contained in the purge stocker is secured. To address with this, a purge device to be provided to each mount has been required to be downsized.

SUMMARY OF THE INVENTION

Preferred embodiments of the present invention provide purge devices, purge stockers, and methods for feeding a purge gas, which are capable of simplifying their configurations and being downsized.

A purge device according to a preferred embodiment of the present invention includes: a plurality of mounts on which containers are to be placed and that are grouped; a nozzle that is structured such that when a container is placed on the corresponding mount, a flow path to supply a purge gas to the container is opened; and a flow rate controller that adjusts a flow rate of the purge gas supplied into a group based on a number of containers in the group.

Furthermore, each of the mounts may include a detector that detects whether the corresponding container is placed thereon. Furthermore, the nozzle may include a lid that closes the flow path due to a pressure of the purge gas in a state in which the container is not placed on the mount, and the lid may release the flow path due to a weight of the container when the container is placed on the mount. Furthermore, when a new container is placed in the group, the flow rate controller may temporarily reduce the flow rate of the purge gas and gradually increase the flow rate to a predetermined flow rate. Furthermore, the plurality of mounts arranged in a horizontal direction or a vertical direction may be set to the group.

A purge stocker according to a preferred embodiment of the present invention includes a plurality of the purge devices.

Furthermore, the purge stocker may include a conveyor that is capable of traveling along the mounts in the purge device and that transfers the containers to the mounts, and the flow rate controllers in the purge device may be arranged collectively on an end side of a traveling range of the conveyor.

A method for feeding a purge gas according to a preferred embodiment of the present invention is a method for feeding a purge gas to containers placed on a plurality of grouped mounts and includes: opening a flow path to supply a purge gas to a container when the container is placed on a corresponding one of the mounts; and adjusting a flow rate of the purge gas supplied into a group based on a number of containers in the group.

With the purge devices according to preferred embodiments of the present invention, in the group, a purge gas flows through a flow path for a mount on which a container is placed, but a purge gas does not flow through a flow path for a mount on which a container is not placed. Thus, when the flow rate of the purge gas is adjusted based on the number of containers in the group, the flow rate of the purge gas supplied to each container is adjusted. Consequently, it is not necessary to provide an electromagnetic valve or a flow rate controller for each mount, and the configuration as a whole is able to be simplified to save space, and hence the purge device is able to be downsized.

Furthermore, with a purge device in which each of the mounts includes the detector that detects whether the corresponding container is placed thereon, the number of containers in the group is able to be detected more reliably. Furthermore, with the purge device in which the nozzle includes the lid that closes the flow path due to the pressure of the purge gas in the state in which the container is not placed on the mount, and the lid releases the flow path due to the weight of the container when the container is placed on the mount, the flow path is able to be reliably opened and closed by the lid. Furthermore, with the purge device in which when a new container is placed in the group, the flow rate controller temporarily reduces the flow rate of the purge gas and gradually increases the flow rate to a predetermined flow rate, it is possible to prevent a massive amount of purge gas from being suddenly supplied to the newly placed container and prevent vibration of a contained matter in the container. Furthermore, with the purge device in which the mounts arranged in a horizontal direction or a vertical direction are set to the group, it is only necessary to provide flow rate controllers each for mounts arranged in the horizontal direction or the vertical direction, and hence space is able to be saved.

A purge stocker according to a preferred embodiment of the present invention includes a plurality of purge devices that are capable of saving space. Consequently, the depth dimension of each mount is able to be reduced to obtain a compact purge stocker.

Furthermore, in the case where the purge stocker includes a conveyor that is capable of traveling along the mounts in the purge device and that transfers the containers to the mounts, and the flow rate controllers in the purge device are arranged collectively on an end side of a traveling range of the conveyor, the flow rate controllers are arranged collectively at a portion of the purge stocker, and hence it is easy for an operator to install and maintain the flow rate controllers while the purge stocker is downsized.

With a method for feeding a purge gas according to a preferred embodiment of the present invention, when a container is placed on a mount, a purge gas flows through a flow path for the mount on which the container is placed, but a purge gas does not flow through a flow path for a mount on which a container is not placed. Thus, when the flow rate of the purge gas is adjusted based on the number of containers in a group, the flow rate of the purge gas supplied to each container is able to be appropriately adjusted. Consequently, it is unnecessary to provide an electromagnetic valve or a flow rate controller for each mount, it is unnecessary to control such an electromagnetic valve or flow rate controller, and the supply of the purge gas is able to be easily controlled.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments are described below with reference to the drawings. Furthermore, in the drawings, some portions are illustrated with the scales appropriately changed, such as being enlarged and exaggerated, for the description of the preferred embodiments. In each of the figures referred to below, an XYZ coordinate system is used to describe the directions in the figure. In the XYZ coordinate system, the vertical direction is a Z direction and the horizontal directions are an X direction and a Y direction. Each of the X direction, the Y direction, and the Z direction indicates a + direction by the direction of the arrow in the figure, and a − direction by the direction opposite to the direction of the arrow.

Figure 1:
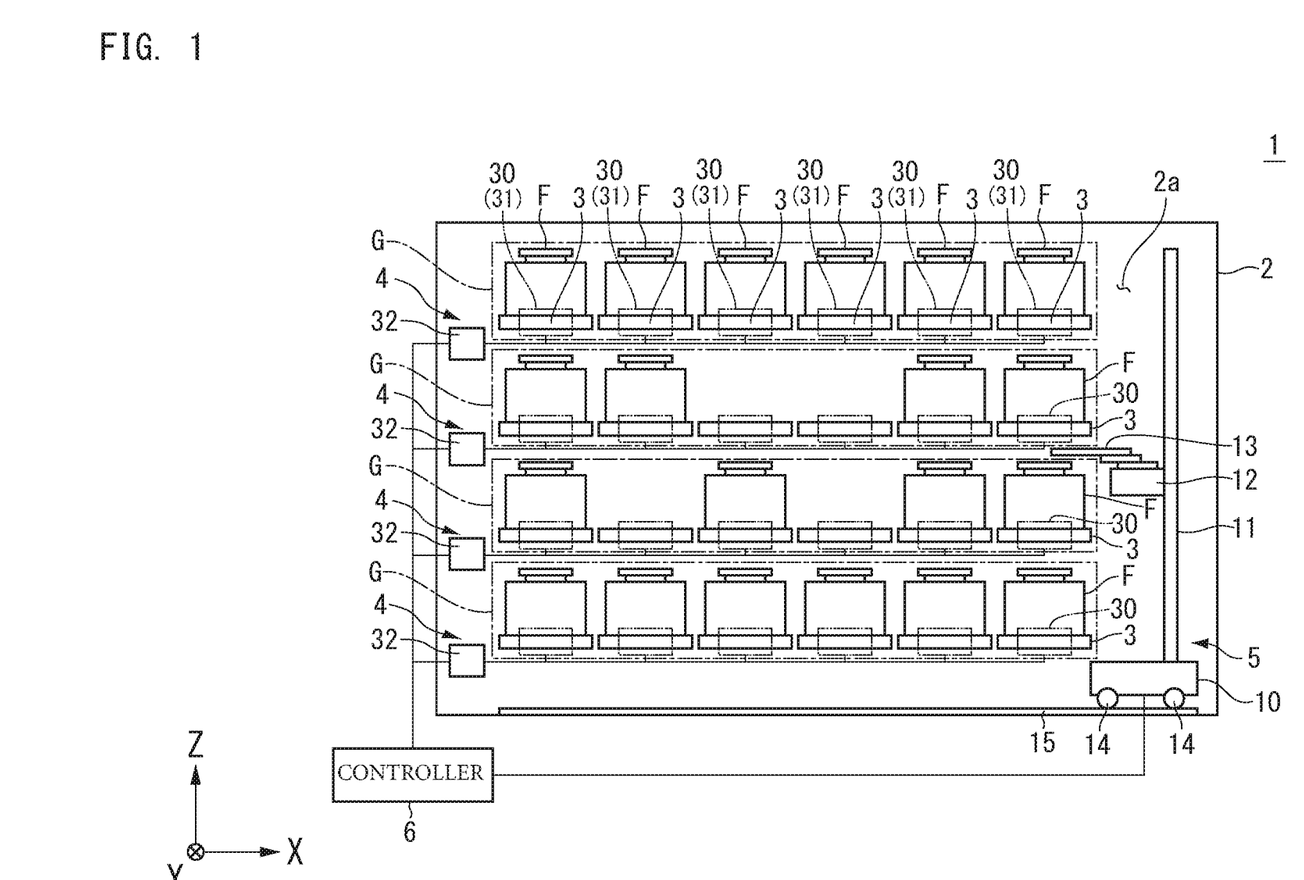
FIG. 1 is a diagram illustrating an example of a purge stocker according to a preferred embodiment of the present invention.

FIG. 1 is a diagram illustrating an example of a purge stocker 1 according to the present preferred embodiment. The purge stocker 1 is, for example, an automatic warehouse that stores therein containers F to contain articles such as wafers and reticles used to manufacture of semiconductor elements. Examples of the containers F include FOUP, SMIF Pod, and reticle Pod.

As illustrated in FIG. 1, the purge stocker 1 includes a stocker casing 2 that forms an outline, a plurality of shelf-shaped mounts 3 disposed in the stocker casing 2, a plurality of purge devices 4, a stacker crane 5 defining and functioning as a conveyor for containers F, and a controller 6. Note that the mounts 3 are sometimes referred to as "storage shelves", for example. The stocker casing 2 includes an internal space 2a that is isolatable from the outside. The stocker casing 2 includes a loading and unloading port (not shown) through which a container F is transferred between the outside of the stocker casing 2 and the internal space 2a. The plurality of mounts 3, the plurality of purge devices 4, and the stacker crane 5 are arranged in the internal space 2a in the stocker casing 2. Note that the mounts 3 may be arranged on both sides (+Y side and −Y side) of a traveling range (X direction) of the stacker crane 5. The controller 6 controls the purge devices 4 and the stacker crane 5. Note that a controller that controls the purge device 4 and a controller that controls the stacker crane 5 may be separately provided.

The stacker crane 5 is capable of conveying the container F in each of the X direction, the Y direction, and the Z direction, and is, for example, capable of conveying the container F between a loading and unloading port and a mount 3 and conveying the container F from a mount 3 to another mount 3. The stacker crane 5 includes, for example, a traveling carriage 10, a support column 11, a support base 12, and a transfer device 13. The traveling carriage 10 includes a plurality of wheels 14, and moves in the horizontal direction (X direction) along a rail 15 provided on the floor.

The support column 11 extends from the top surface of the traveling carriage 10 in the vertical direction (Z direction). The support base 12 is supported by the support column 11, and is provided to be slidable in the Z direction along the support column 11. The transfer device 13 includes, for example, an extendable arm and a hand including a top surface on which a container F is able to be placed. Note that the upper end of the support column 11 may be guided to a rail laid on the ceiling of the stocker casing 2. Furthermore, for example, as a conveyor for the container F, in place of the stacker crane 5 that places thereon the container F and conveys it as described above, a device that grips a flange 28 (see FIG. 2) provided on top of the container F and transfers the container F while suspending the container F or a device that transfers the container F while gripping a side surface of the container F may be used. Furthermore, although FIG. 1 illustrates one stacker crane 5, the number of the stacker cranes 5 arranged in the stocker casing 2 may be two or more.

The mounts 3 are arranged in a plurality of stages in the vertical direction (Z direction) and arranged in a plurality of rows in the horizontal direction (X direction). The mounts 3 are each capable of placing a container F thereon. The mounts 3 are grouped. In the present preferred embodiment, mounts 3 arranged in the horizontal direction are set as one group G.

Figure 2:
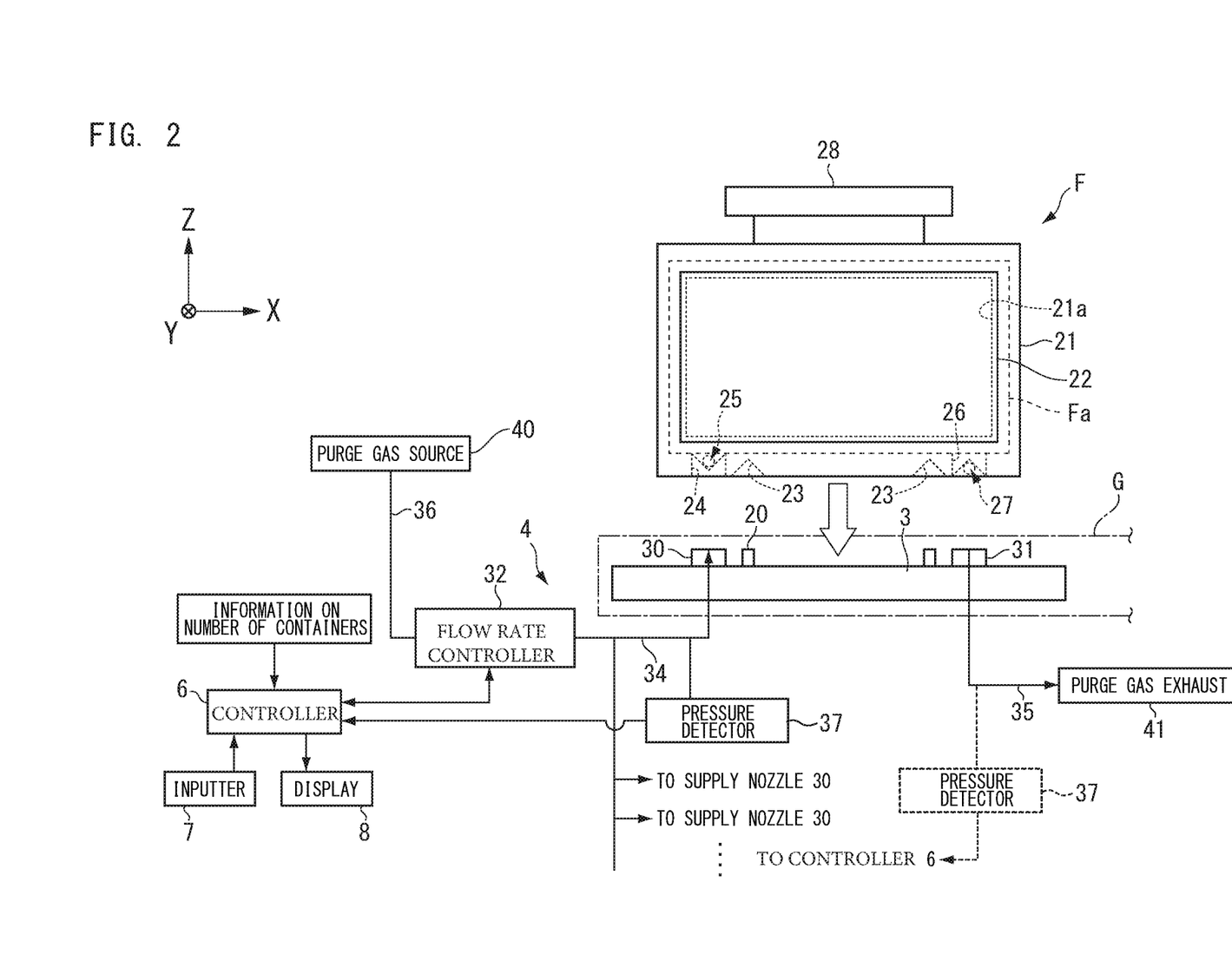
FIG. 2 is a diagram illustrating an example of a purge device according to a preferred embodiment of the present invention.
Figure 3:
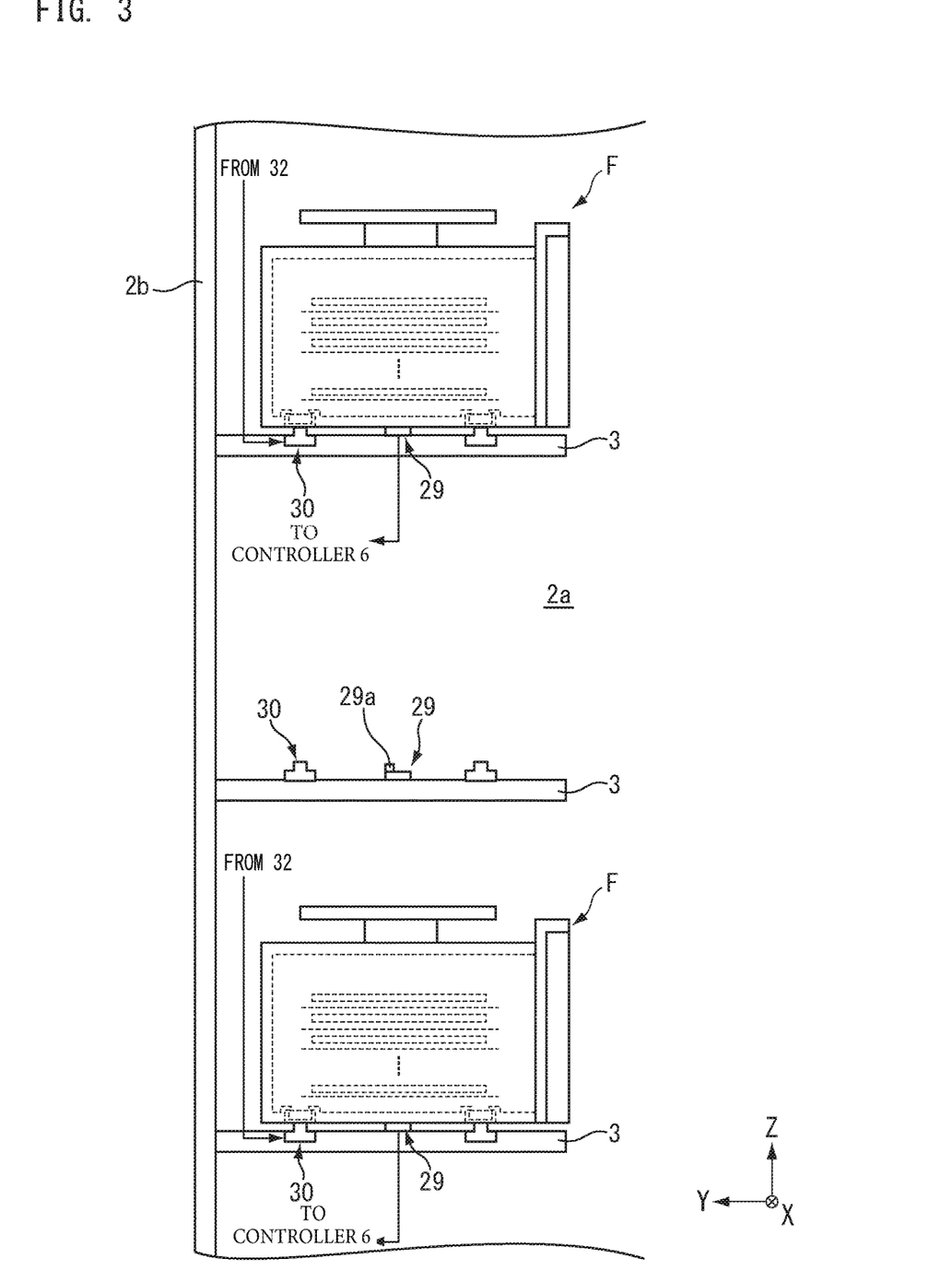
FIG. 3 is a diagram illustrating a state in which containers are placed on mounts.

FIG. 2 is a diagram illustrating an example of the container F and the purge device 4. FIG. 3 is a diagram illustrating a portion inside the purge stocker 1, and illustrates a state in which the containers F are placed on the mounts 3. As illustrated in FIG. 2, pins 20 are provided on the top surface of the mount 3 and are used to position the container F. FIG. 2 illustrates FOUP as an example of the container F. The container F includes a box-shaped main body 21 including an opening 21a and a lid 22 that closes the opening 21a. An article such as a wafer is contained in the interior Fa of the container F through the opening 21a. The main body 21 includes, on its bottom surface side, recesses 23 for positioning. Examples of the recesses 23 include grooves that radially extend from the center of the bottom surface of the main body 21. Pins (not shown) provided to a hand of the transfer device 13 are to be fitted into the recesses 23 such that the container F is positioned when the container F is conveyed.

Furthermore, as illustrated in FIG. 3, a placement sensor 29 is provided on the top surface of each mount 3. The placement sensor 29 detects whether a container F is placed on the mount 3. The placement sensor 29 illustrated in FIG. 3 includes a switch 29a that protrudes upward. The switch 29a is pressed down when the container F is placed on the mount 3. An optical sensor is provided inside the placement sensor 29. The optical sensor receives light emitted from a light source by a photoreceptor, and converts the light into an electric signal. The electric signal converted by the photoreceptor is transmitted to the controller 6. In the placement sensor 29, when the switch 29a is pressed down, the light from the light source is blocked. The controller 6 determines that the container F is placed on the mount 3 for each mount 3 based on the electric signal transmitted from the placement sensor 29. Note that the placement sensor 29 is not limited to the above-mentioned configuration, and a contact or contactless sensor that is capable of detecting that the container F has been placed can be used.

The mount 3 includes a cutout (see FIG. 8 and other figures) that allows the hand of the transfer device 13 to pass therethrough in the vertical direction. The transfer device 13 causes the hand to move inward from above the mount 3 through the cutout to transfer a container F onto the top surface of the mount 3. At this time, the pins 20 of the mount 3 are inserted in the recesses 23, and hence the container F is positioned with respect to the mount 3. The main body 21 includes, on the bottom surface side, an introduction port 24 for purge gas, a check valve 25, an exhaust port 26, and a check valve 27. The introduction port 24 and the exhaust port 26 communicate with the interior Fa in the main body 21 and the outside, respectively. The check valves 25 and 27 are provided in the introduction port 24 and the exhaust port 26, respectively.

The purge device 4 includes a supply nozzle (nozzle) 30, exhaust nozzle 31, and a flow rate controller 32. In FIG. 2 and FIG. 3, the supply nozzle 30 and the exhaust nozzle 31 are conceptually illustrated. The supply nozzle 30 and the exhaust nozzle 31 are provided on the top surface of the mount 3. The supply nozzle 30 and the exhaust nozzle 31 are arranged so as to be connected to the introduction port 24 and the exhaust port 26, respectively, when the container F is placed on the mount 3. When the container F is placed on the mount 3, the introduction port 24 in the container F is connected to the pipe 34 through the supply nozzle 30, and is further connected to the purge gas source 40 through the flow rate controller 32. The exhaust nozzle 31 is connected to an exhaust path for the purge gas (purge gas exhaust 41) through the pipe 35. Note that the purge device 4 is not necessarily required to include the exhaust nozzle 31 and the pipe 35. In this case, the purge gas discharged from the exhaust port 26 in the container F is discharged into the internal space 2a in the purge stocker 1.

As illustrated in FIG. 3, the supply nozzle 30 closes the flow path of the purge gas in the state in which the container F is not placed on the mount 3, and releases the flow path due to the weight of the container F when the container F is placed on the mount 3. FIG. 3 illustrates the state in which containers F are placed on mounts 3 at the top stage and the bottom stage such that flow paths for purge gas are formed, and a flow path for purge gas in a mount at the middle stage is closed because the container F is not placed. Note that the detailed configuration of the supply nozzle 30 is described later.

As illustrated in FIG. 2, the purge gas source 40 supplies an inactive gas, such as a nitrogen gas, to an accommodated article as a purge gas. The purge gas is selected depending on an article accommodated in the container F. For example, a gas to suppress oxidation and molecular contamination of articles or a gas to reduce moisture in the container F is used. For the purge gas, a nitrogen gas or a clean dry air (CDA) is used. The purge gas source 40 may be a part of the purge stocker 1, or may be a device outside the purge stocker 1. For example, a facility in a factory where the purge stocker 1 is installed may be used. In the case where the purge gas source 40 is separated from the purge stocker 1, a purge gas from the purge gas source 40 may be temporarily received by a pressure adjustment device on the purge stocker 1 side, and the purge gas may be supplied to each flow rate controller 32 from the pressure adjustment device.

To purge the container F, a purge gas from the purge gas source 40 is supplied via the flow rate controller 32 and the pipe 34 to the interior Fa through the introduction port 24 in the container F, and is filled in the interior Fa in the container F. The pipe 34 branches from the middle of the flow path, and supplies the purge gas to the supply nozzles 30 in the group G. Furthermore, a gas in the interior Fa in the container F is discharged to the outside of the container F through the exhaust port 26, and is discharged to the outside by the purge gas exhaust 41 through the pipe 35. Note that the purge gas exhaust 41 may be provided with a device that sucks a gas by using a pump.

A non-limiting example of the flow rate controller 32 is a mass flow controller. The flow rate controller 32 controls the flow rate of purge gas in the pipe 34, thus controlling the flow rate of purge gas supplied from the purge gas source 40 to the supply nozzle 30. The flow rate controller 32 is communicable to the controller 6. The flow rate controller 32 receives a flow rate setting signal that determines a set value of the flow rate from the controller 6, and controls the flow rate of the purge gas to approach the set value. The set value is set based on the number of containers F in a group G. The controller 6 determines the number of containers F in the group G based on the signal from the placement sensor 29 described above, and outputs a flow rate setting signal suited for the number of the containers F to the flow rate controller 32.

Note that the controller 6 may determine the number of containers F in the group G and output the number to the flow rate controller 32 based on, for example, information on the containers F transferred by the stacker crane 5 in place of the signal from the placement sensor 29. In this case, the placement sensor 29 is unnecessary for the mount 3, and hence the manufacturing cost is able to be reduced. Furthermore, the flow rate controller 32 may receive, in place of receiving a flow rate setting signal from the controller 6, information on the number of containers F in the group G, and calculate a set value based on the number of containers F by using a control circuit inside the flow rate controller 32.

The flow rate controller 32 adjusts the flow rate of purge gas supplied to the group G based on the number of containers F in the group G. For example, the flow rate of purge gas is able to be set to a value proportional to the number of containers F, but is not limited thereto. The flow rate controller 32 is connected to supply nozzles 30 of a plurality of mounts 3 arranged in the group G. In the group G, purge gas flows through a flow path for a mount 3 on which a container F is placed, but purge gas does not flow through a flow path for a mount 3 on which a container F is not placed. Thus, the flow rate controller 32 is capable of adjusting the flow rate of the purge gas based on the number of containers F in the group G to adjust the flow rate of the purge gas supplied to each container F.

Furthermore, the flow rate controller 32 performs various kinds of operations in response to operation instructions (commands) from the controller 6. For example, when the flow rate controller 32 receives an operation instruction to output various kinds of signals, the flow rate controller 32 outputs an output signal to the controller 6 as a response to the operation instruction.

An inputter 7 and a display 8 are connected to the controller 6. Examples of the inputter 7 include an operation panel, a touch panel, a keyboard, a mouse, and a trackball. The inputter 7 detects an input from an operator, and supplies input information to the controller 6. For example, the operator is capable of setting and changing the flow rate of purge gas by operating the inputter 7. Examples of the display 8 include a liquid crystal display. The display 8 displays images supplied from the controller 6. For example, the controller 6 displays images indicating the operating status, various kinds of settings, and the purging state in the purge stocker 1 on the display 8.

As illustrated in FIG. 2, in the purge device 4, a pressure detector 37 may be connected to the pipe 34 on the downstream side of the flow rate controller 32. The pressure detector 37 monitors a pressure of purge gas flowing in the pipe 34 through the flow rate controller 32, and detects the purging state in the container F. The pressure detector 37 outputs the measurement result (measured value) to the controller 6 in a wired or wireless manner. For example, the controller 6 may determine the purging state by comparing the measurement result of the pressure detector 37 and a predetermined value (threshold). The measured value of the pressure detector 37 is a substantially constant value when the purge gas is properly supplied, but becomes larger or smaller than a predetermined range when an abnormality occurs in the container F or the purge device 4. As a result, it is able to check abnormality of purging to the container F. Note that the pressure detector 37 may be connected to the exhaust-side pipe 35, or may be arranged on both the pipes 34 and 35.

When a container F is connected to the purge device 4, a connection failure between the introduction port 24 in the container F and the supply nozzle 30 may occur due to misalignment between the container F and the purge device 4. In this case, a purge gas leaks from a gap between the introduction port 24 and the supply nozzle 30, and the purge gas supplied to the interior Fa in the container F becomes insufficient, with the result that a purging failure occurs. Furthermore, a purging failure occurs also when the pipes 34 and 35 are clogged or when a large amount of purge gas leaks from a gap between the lid 22 and the main body 21 in the container F. The controller 6 may record the result of performing the quality determination of purging to the container F, such as a determination result indicating when and which of purge devices 4 has caused a purging failure, in a log, or may display a determination result on the display 8 or notify a determination result by using another notification device or method.

Figure 4:
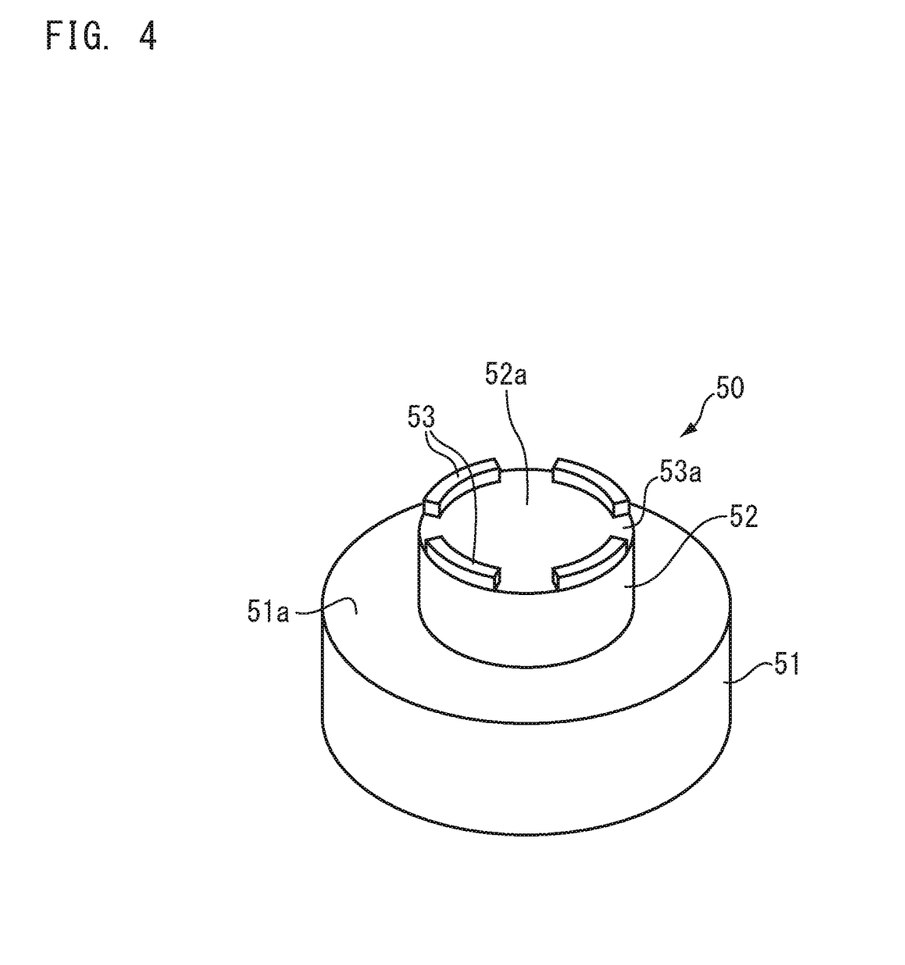
FIG. 4 is a perspective view illustrating an example of a lid used for a nozzle.

FIG. 4 is a perspective view illustrating an example of the lid used for the supply nozzle 30. As illustrated in FIG. 4, the lid 50 includes a first cylinder 51 having a large diameter, a second cylinder 52 having a small diameter, and spacers 53 provided on the top surface side of the second cylinder. The second cylinder 52 is provided on the upper side of the first cylinder 51 at the center or substantially the center. The first cylinder 51 and the second cylinder 52 are integrated through a step 51*a*. A lower portion of the first cylinder 51 is opened. The second cylinder 52 is closed on the top surface side by a ceiling 52*a*. A lower portion of the second cylinder 52 is connected to the step 51*a* and opened. The plurality of spacers 53 are provided on the ceiling 52*a* along a circumferential edge of the ceiling 52*a*. The spacers 53 are arranged with a plurality of gaps 53*a* in the circumferential direction of the ceiling 52*a*. The top surface of the spacer 53 is brought into contact with the bottom of the container F.

Figure 5A:
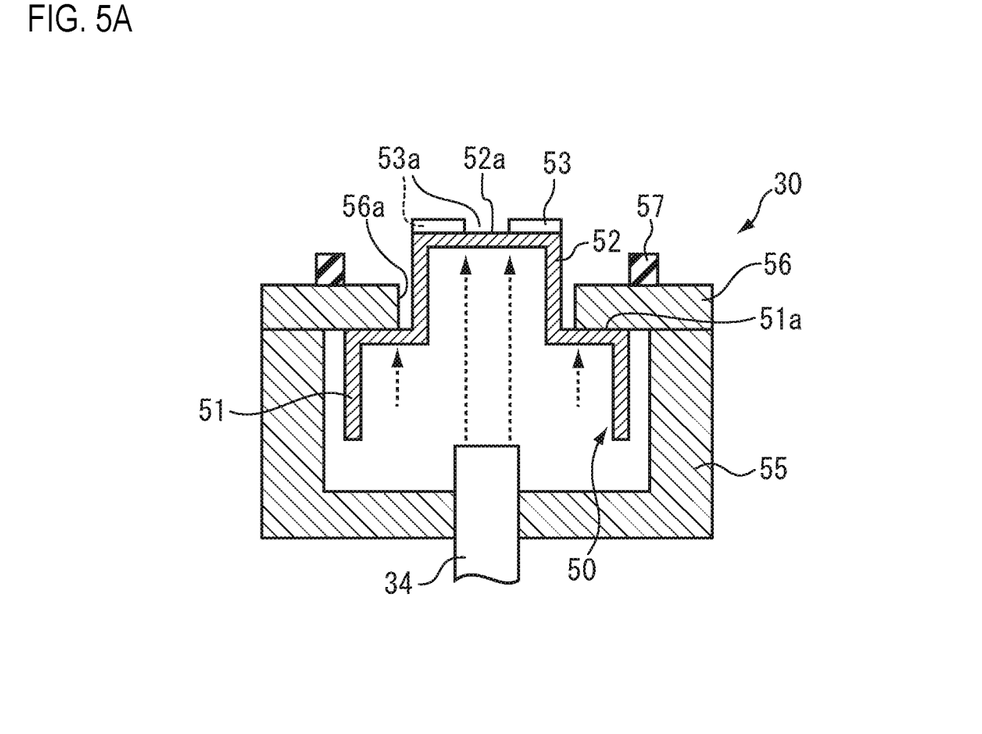
FIGS. 5A and 5B include diagrams illustrating an example of a supply nozzle including the lid illustrated in FIG. 4.
Figure 5B:
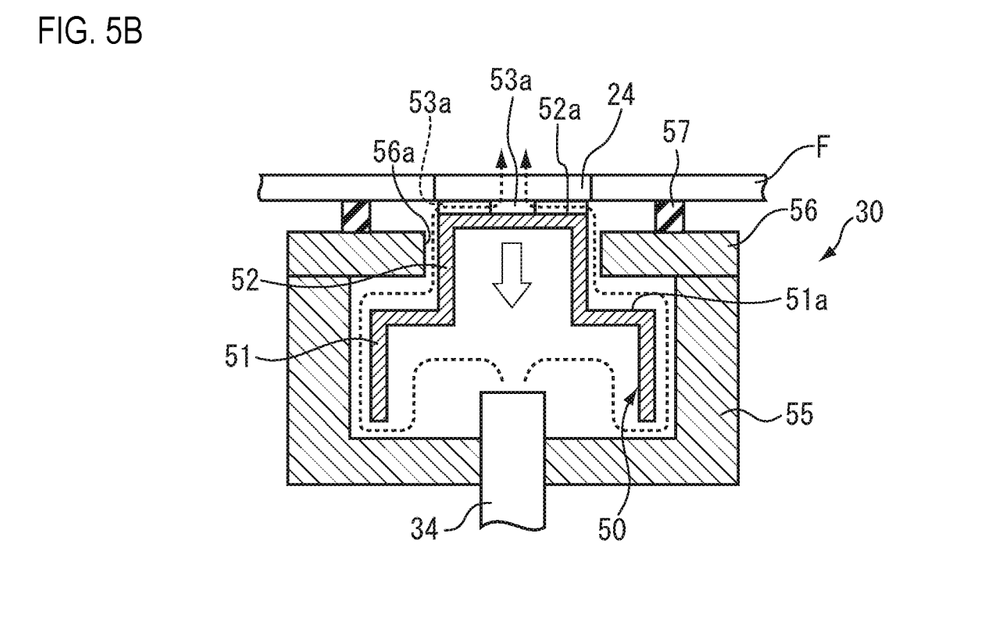

The supply nozzle 30 including the lid 50 described above closes the flow path of purge gas in the state in which the container F is not placed on the mount 3. Furthermore, when the container F is placed on the mount 3, the lid 50 releases the flow path due to the weight of the container F. FIGS. 5A and 5B include diagrams illustrating an example of the supply nozzle 30 including the lid 50 illustrated in FIG. 4. As illustrated in FIGS. 5A and 5B, the lid 50 is housed in a flow path forming portion 55 disposed on the mount 3. The flow path forming portion 55 preferably has a cylindrical shape, and an annular member 56 is mounted on top of the flow path forming portion 55.

Furthermore, the flow path forming portion 55 is connected with an end of the pipe 34, and is supplied with a purge gas inside. The flow path forming portion 55 defines a flow path of the purge gas. The annular member 56 includes a through hole 56*a* at the center or substantially the center. A square ring 57 is provided on the top surface side of the annular member 56 so as to surround the through hole 56*a*. The square ring 57 is preferably made of an elastic member such as rubber. The square ring 57 is an annular member with a rectangular cross section. The top surface of the square ring 57 abuts the bottom of the container F.

In the lid 50, the first cylinder 51 is disposed in the flow path forming portion 55, and the second cylinder 52 is disposed so as to protrude upward from the through hole 56*a*. A gap that allows a purge gas to flow therethrough is defined between the second cylinder 52 and the through hole 56*a*. As illustrated in FIG. 5A, in the state in which the container F is not placed on the mount 3, the lid 50 is pushed upward due to the pressure of the purge gas supplied from the pipe 34, and the step 51*a* of the lid 50 is pressed against the bottom surface of the annular member 56. As a result, the through hole 56*a* is closed. In this manner, the lid 50 closes the flow path due to the pressure of the purge gas in the state in which the container F is not placed on the mount 3. Note that an elastic member such as a coil spring may be disposed in order to push the lid 50 upward.

By contrast, as illustrated in FIG. 5B, when the container F is placed on the mount 3, the lid 50 moves downward due to the weight of the container F, and the bottom surface of the container F contacts with the square ring 57. As a result, a region surrounded by the square ring 57 is sealed. Furthermore, in the lid 50, the spacer 53 is pushed by the bottom of the container F and moves downward, and the step 51a is separated away from the bottom surface of the annular member 56. Thus, a gap is defined between the step 51a and the bottom surface of the annular member 56. As a result, a purge gas in the flow path forming portion 55 enters the region surrounded by the square ring 57 from the gap between the step 51a and the annular member 56 through the gap between the second cylinder 52 and the through hole 56a, and reaches the introduction port 24 in the container F through the gaps 53a on the spacers 53. In this manner, the lid 50 releases the flow path of the purge gas due to the weight of the container F when the container F is placed on the mount 3. The purge gas supplied from the pipe 34 is supplied to the inside of the container F from the introduction port 24 through the flow path.

Note that, when the container F placed on the mount 3 moves upward, the lid 50 moves upward due to the pressure of the purge gas from the pipe 34, and the step 51a contacts with the bottom surface of the annular member 56, returning to the state in which the flow path of the purge gas is closed.

Figure 6:
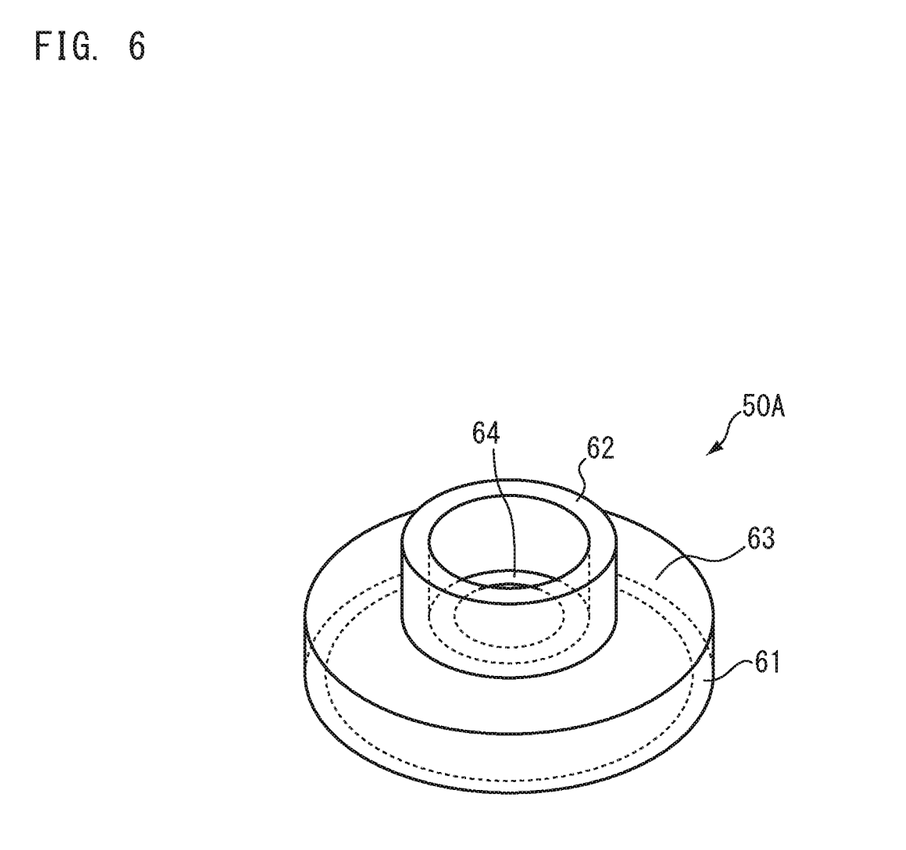
FIG. 6 is a perspective view illustrating a lid for a nozzle according to a modification of a preferred embodiment of the present invention.

Note that the supply nozzle 30 is not limited to the one using the lid 50 having the above-mentioned configuration, and another lid may be used. FIG. 6 is a perspective view illustrating an example of a lid 50A according to a modification of a preferred embodiment of the present invention. As illustrated in FIG. 6, the lid 50A includes a mount 61 having a large diameter, a container support 62 having a small diameter, an annular deformation portion 63, and a flange 64. The mount 61 preferably has a cylindrical shape, and is attached to a flow path forming portion 65 described later. The container support 62 preferably has a cylindrical shape, and is provided on the deformation portion 63 that extends to the inner side from an upper portion of the mount 61. The upper end of the container support 62 is brought into contact with the bottom surface of the container F. The flange 64 preferably has an annular shape so as to protrude inward on the inner side of the container support 62. The lid 50A is preferably integrally defined by an elastic member such as rubber such that at least the deformation portion 63 is deformable.

Figure 7A:
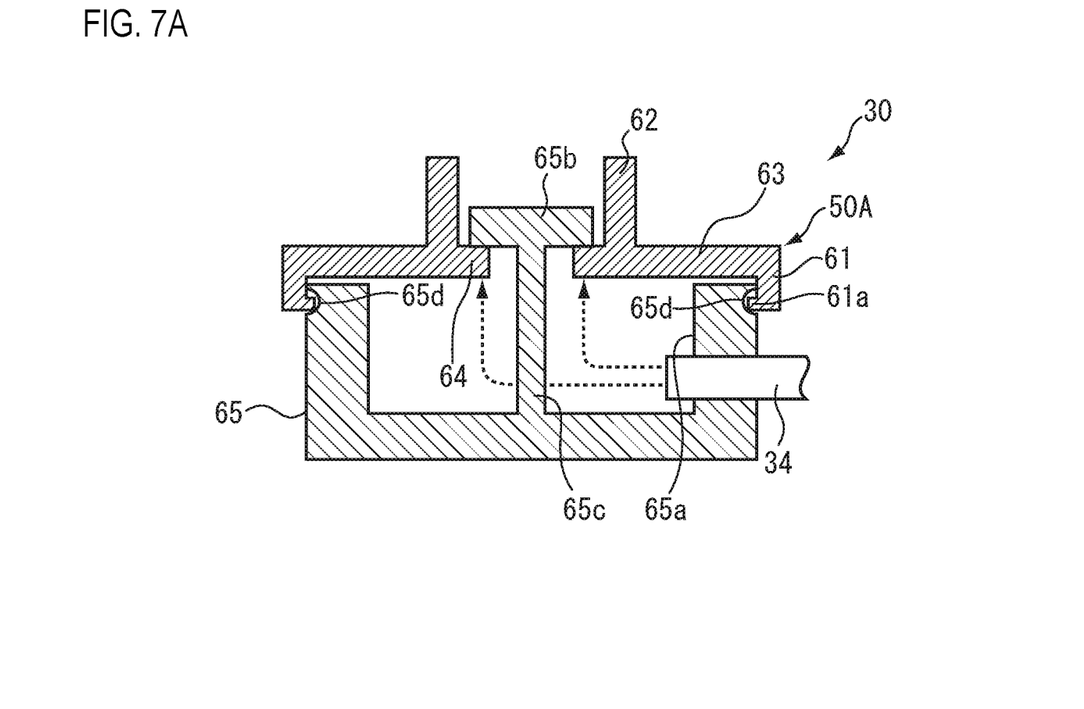
FIGS. 7A and 7B include diagrams illustrating an example of a supply nozzle including the lid illustrated in FIG. 6.
Figure 7B:
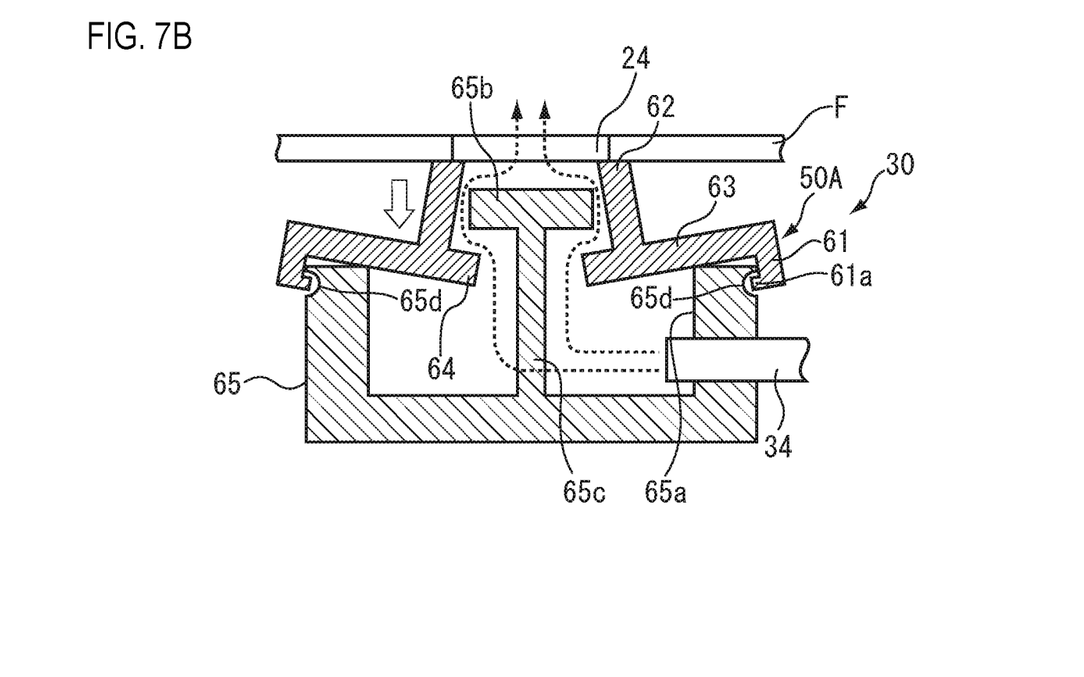

FIGS. 7A and 7B are diagrams illustrating an example of the supply nozzle 30 including the lid 50A. As illustrated in FIG. 7A, the lid 50A is attached to a flow path forming portion 65 in a state in which a protrusion 61a provided on an inner side of a lower end of a mount 61 enters an annular groove 65d provided on an outer periphery of an upper portion of the flow path forming portion 65. In the flow path forming portion 65, a pipe 34 is connected, and a disc-shaped closing portion 65b is provided on top of a column 65c that projects from the center or substantially the center of the bottom. The closing portion 65b preferably has an outer diameter that allows the closing portion 65b to be disposed in the container support 62 of the lid 50A. In the state in which the lid 50A is attached to the flow path forming portion 65, the top surface of the flange 64 of the lid 50A abuts the bottom surface of the closing portion 65b.

As illustrated in FIG. 7A, in the state in which the container F is not placed on the mount 3, the lid 50A is pushed upward due to the pressure of purge gas supplied from the pipe 34, and the top surface of the flange 64 is pressed against the bottom surface of the closing portion 65b. Furthermore, the flow path of the purge gas to the container F is closed because the protrusion 61a of the mount 61 is fitted into the annular groove 65d. In this manner, the lid 50A closes the flow path due to the pressure of the purge gas in the state in which the container F is not placed on the mount 3. Note that an elastic member such as a coil spring may be disposed in order to push the lid 50A upward.

By contrast, as illustrated in FIG. 7B, when the container F is placed on the mount 3, the container support 62 abuts on the bottom of the container F and is pushed downward by the weight of the container F. As a result, the deformation portion 63 deforms such that the container support 62 moves downward. Then, the top surface of the flange 64 is separated away from the bottom surface of the closing portion 65b. Then, a flow path of the purge gas in the flow path forming portion 65 extends to the introduction port 24 from the gap between the flange 64 and the closing portion 65b through the container support 62. Note that the bottom surface of the deformation portion 63 is in contact with the upper end of an inner wall 65a of the flow path forming portion 65 to prevent the purge gas from leaking to the outside. In this manner, the lid 50A releases the flow path due to the weight of the container F when the container F is placed on the mount 3. The purge gas supplied from the pipe 34 flows along the released flow path, and is supplied to the inside of the container F through the introduction port 24.

Note that, when the container F placed on the mount 3 moves upward, the lid 50A is restored to its original form due to the pressure of the purge gas from the pipe 34 and its own elastic force, and contacts with the closing portion 65b of the flange 64, thus returning to the state in which the flow path of the purge gas is closed.

Figure 8:
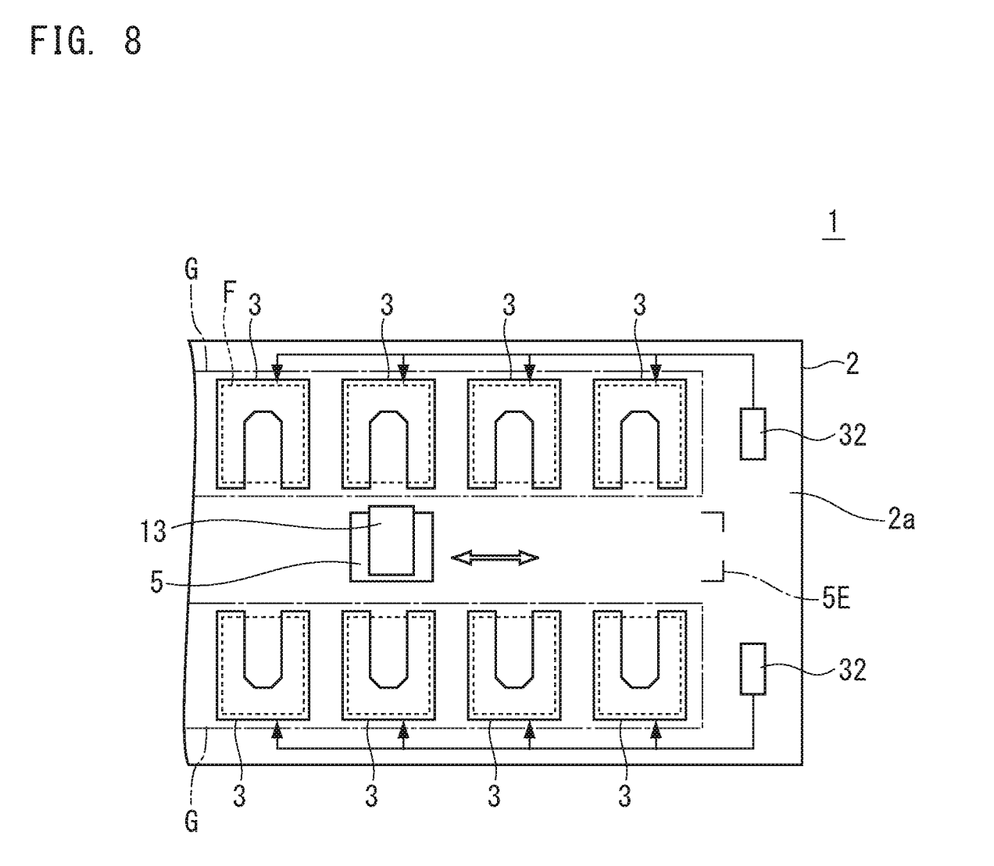
FIG. 8 is a diagram illustrating an example of the arrangement of flow rate controllers.

FIG. 8 is a diagram illustrating an example of the arrangement of the flow rate controllers 32. As illustrated in FIG. 8, one flow rate controller 32 is provided for each group G of mounts 3. In the purge stocker 1, for example, the flow rate controllers 32 are arranged collectively on an end 5E side of the traveling range of the stacker crane 5. As illustrated in FIG. 8, in the case where the mounts 3 are arranged in two rows across the stacker crane 5 and a group G is set for each row, the flow rate controller 32 is provided for each row. Note that the mounts 3 in two rows across the stacker crane 5 may be set as one group G, and one flow rate controller 32 may be disposed.

In this manner, the flow rate controllers 32 are arranged collectively on the end 5E side of the traveling range of the stacker crane 5, and hence it is unnecessary to dispose a flow rate controller 32 behind the mounts 3. Furthermore, an electromagnetic valve is not required to be provided for each mount 3, and hence it is able to reduce the depth dimension of the mount and downsize the purge stocker 1. Furthermore, the flow rate controllers 32 are arranged collectively at a portion of the purge stocker, and hence it is easy for an operator to install and maintain the flow rate controller 32.

Figure 9:
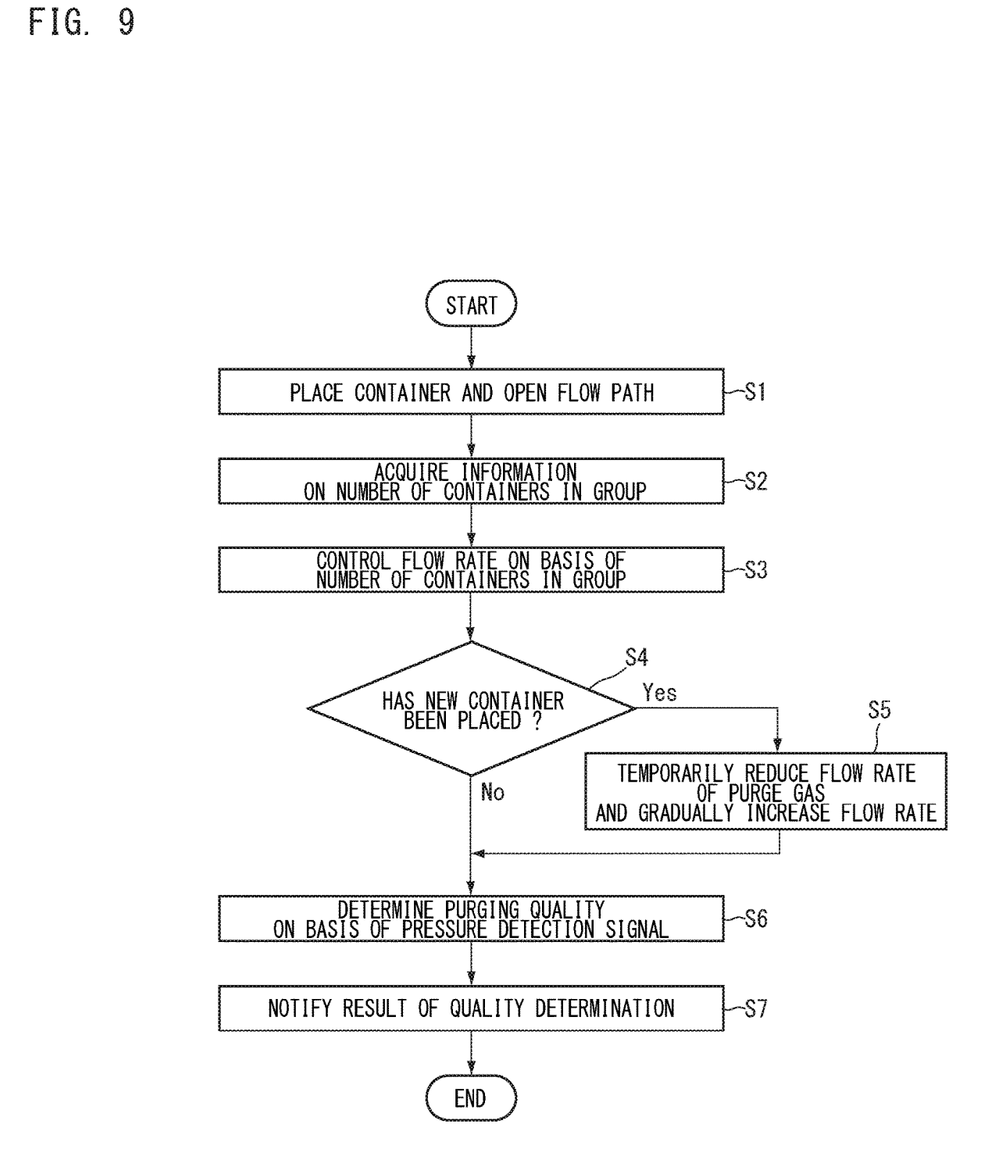
FIG. 9 is a flowchart illustrating an example of a method for feeding a purge gas according to a preferred embodiment of the present invention.

FIG. 9 is a flowchart illustrating an example of a method for feeding a purge gas according to the present preferred embodiment. As described above, when a container F is placed on the mount 3 by the stacker crane 5, the supply nozzle 30 opens a flow path of purge gas (Step S1). Then, the supply of purge gas by the purge device 4 to the container F placed on the mount 3 is started.

Furthermore, when the container F is placed on the mount 3, a signal indicating that the container F has been placed is transmitted from the placement sensor 29 to the controller 6. The controller 6 acquires the number of containers F in a group G based on the signal (Step S2). Note that the controller 6 may acquire the number of containers F in the group G from a controller for the purge stocker 1. The controller 6 sets the flow rate of purge gas based on the number of containers F in the group G, and transmits the set value to the flow rate controller 32. The flow rate controller 32 controls the flow rate of purge gas based on the set value from the controller 6 (Step S3).

Next, the controller 6 determines whether a new container F has been placed in the group G (Step S4). The placement of a new container F may be based on a signal of the placement sensor 29 or based on information transmitted from a controller for the purge stocker 1. When a new container F has been placed (Yes at Step S4), the controller 6 instructs the flow rate controller 32 to temporarily reduce the flow rate of purge gas and gradually increase the flow rate to a predetermined flow rate (Step S5). As a result, an abrupt increase in the flow rate of the purge gas is suppressed to prevent a contained matter in the container F from vibrating. Note that whether to perform Steps S4 and S5 as described above can be freely determined.

Next, the controller 6 determines the quality of purging based on a detection signal of the pressure detector 37 (Step S6). The controller 6 displays the determination result on the display (Step S7), and finishes a series of processing. Note that, in the quality determination of purging at Step S6, when the pressure detector 37 is disposed on the supply-side pipe 34 branched into a plurality of pipes, it is determined that a purging failure has occurred in any one of the containers F in the group G. Furthermore, in the case where the pressure detector 37 is disposed on the exhaust-side pipe 35 for each mount 3 (see FIG. 2), it is able to determine which of containers F has a purge failure.

In this manner, according to the present preferred embodiment, in the group G, a purge gas flows through a flow path for a mount 3 on which a container F is placed, but a purge gas does not flow through a flow path for a mount 3 on which a container F is not placed. Thus, when the flow rate of the purge gas is adjusted based on the number of containers F in the group G, the flow rate of the purge gas supplied to each container F is adjusted. Consequently, it is not necessary to provide an electromagnetic valve or a flow rate controller 32 for each mount 3, it is unnecessary to control such an electromagnetic valve or flow rate controller 32, and the control of the supply of the purge gas by the controller 6 is made easy.

Figure 10:
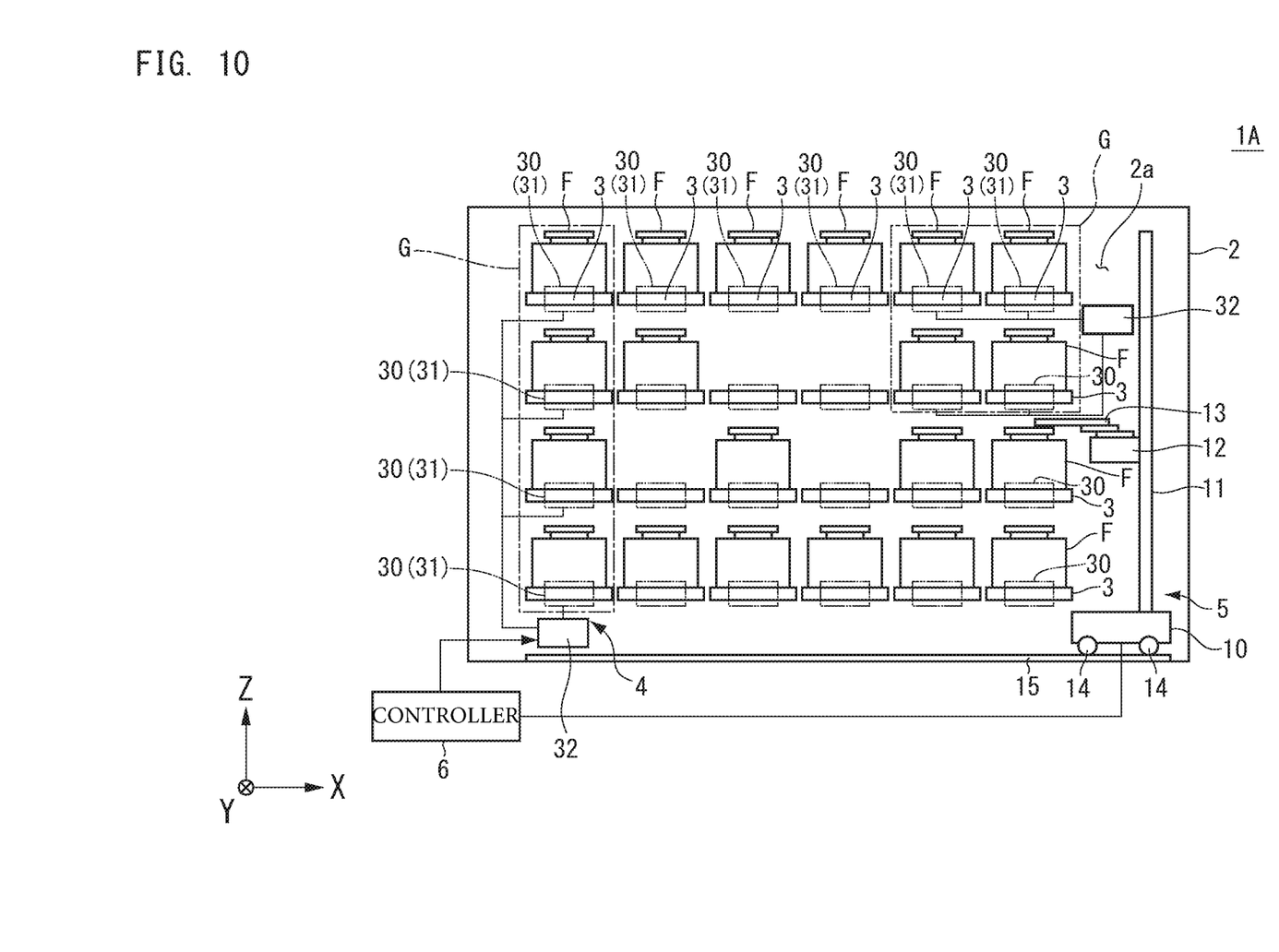
FIG. 10 is a diagram illustrating a purge stocker according to a modification of a preferred embodiment of the present invention.

Note that, in the above-mentioned preferred embodiment, in regard to the mounts 3 in the purge stocker 1, a group G is set for each group of mounts 3 in one row arranged in the horizontal direction, but the preferred embodiment is not limited thereto. FIG. 10 is a diagram illustrating an example of a purge stocker 1A according to a modification of a preferred embodiment of the present invention. As illustrated by the example on the left side in FIG. 10, mounts 3 arranged in one row in the vertical direction may be set as one group G. Furthermore, as illustrated by the example on the upper right in FIG. 10, mounts 3 arranged in two or more rows in the horizontal direction and the vertical direction may be set as one group G. Furthermore, the arrangement is not limited to the example illustrated in FIG. 10, and mounts 3 in the group G are freely settable as long as the group G includes mounts 3. For example, mounts 3 arranged apart from each other may be set as one group G.

Furthermore, in the example illustrated in FIG. 8, the configuration in which the flow rate controllers 32 are arranged collectively on the end 5E side of the traveling range of the stacker crane 5 has been described as an example, but the preferred embodiments are not limited thereto. For example, as illustrated in the lower left in FIG. 10, the flow rate controller 32 may be disposed below mounts 3 arranged in one row in the vertical direction.

Although not illustrated, the flow rate controller 32 may be disposed above mounts 3 arranged in one row in the vertical direction.

Figure 11:
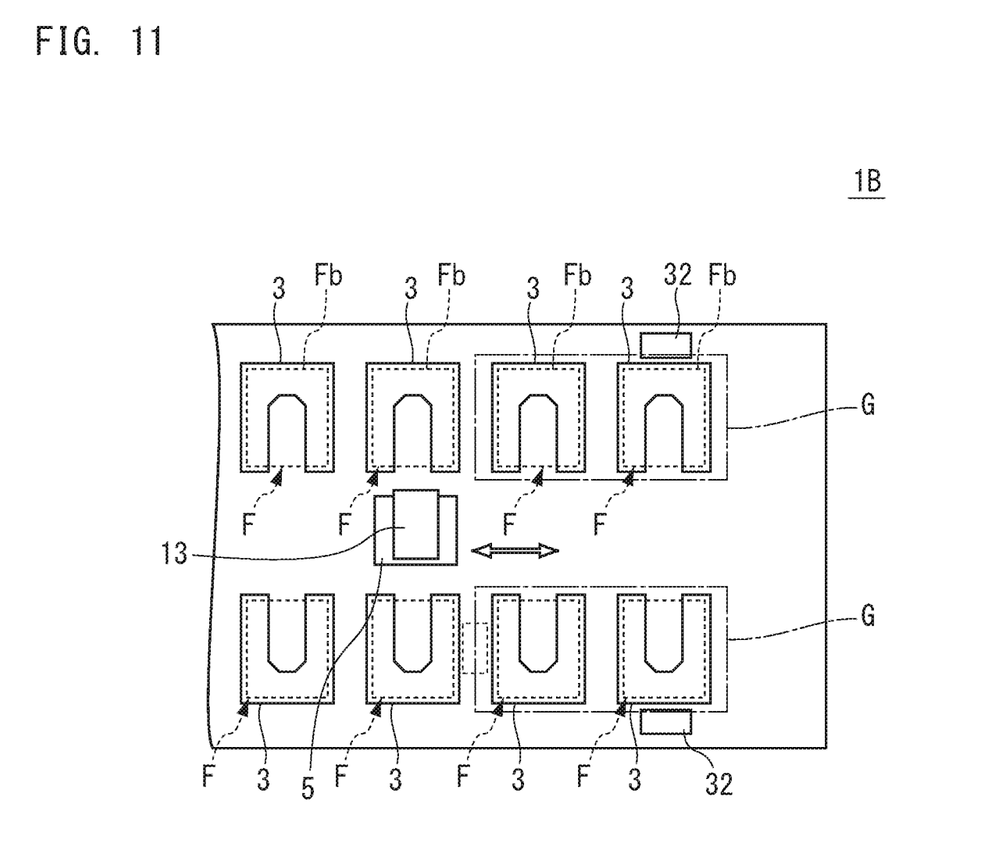
FIG. 11 is a diagram illustrating the arrangement of flow rate controllers according to a modification of a preferred embodiment of the present invention.

FIG. 11 is a diagram illustrating an example of a purge stocker 1B according to a modification of a preferred embodiment of the present invention. As illustrated in FIG. 11, in the purge stocker 1B, a flow rate controller 32 may be disposed on the back surface Fb side of a container F held on a mount 3. Here, the back surface Fb side of the container F refers to the side opposite to the side where the transfer device 13 of the stacker crane 5 makes an access. In FIG. 11, the back surface Fb side of the container F is the side where a wall of the stocker casing 2 is disposed. In this case, for example, the flow rate controller 32 is disposed in a space between the mount 3 and the wall on the back surface Fb side of the container F. Furthermore, when the flow rate controller 32 is disposed on the back surface Fb of the container F, for example, the flow rate controller 32 may be disposed between two adjacent mounts 3.

While the preferred embodiments of the present invention have been described above, the technical scope of the present invention is not limited to the above-mentioned preferred embodiments or modifications. Furthermore, the requirements described in the above-mentioned preferred embodiments or modifications can be combined as appropriate. For example, in the purge stocker 1 illustrated in FIG. 1, every mount 3 is set in any group G and connected to the purge device 4, but purge devices 4 may be individually provided for some mounts 3 in a manner that these mounts 3 are not set in the group G. Furthermore, some mounts 3 may be set to be excluded in a group G so as not to be connected to the purge device 4. For a mount 3 that is not connected to the purge device 4, the stacker crane 5 may place a container F on a mount 3 connected to the purge device 4 and transfer the purged container F to the mount 3 that is not connected to the purge device 4. Furthermore, as far as is permitted by the law, the contents of Japanese Patent Application No. 2015-153757 and all the documents cited in the above-mentioned preferred embodiments are partially incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A purge stocker comprising:
    a plurality of purge devices each comprising:
        a plurality of mounts that are arranged in a horizontal direction, on which containers are to be placed, and that are grouped;
        a nozzle that is structured such that when a container is placed on the corresponding mount, a flow path to supply a purge gas to the container is opened; and
        a flow rate controller that adjusts a flow rate of the purge gas supplied into a group based on a number of containers in the group; and
    a conveyor that is capable of traveling along the mounts and that transfers the containers to the mounts, wherein
    the flow rate controllers of the plurality of purge devices are arranged collectively on an end side of a traveling range of the conveyor;
    each of the plurality of mounts includes a detector that detects whether the corresponding container is placed thereon;

the flow rate controller for the group sets the flow rate of the purge gas supplied into the group to a first flow rate based on a first number of containers in the group acquired from a detection result of the detectors of the plurality of mounts; and when a new container is placed in the group, the flow rate controller for the group temporarily reduces the flow rate of the purge gas supplied into the group from the first flow rate and gradually increases the flow rate to a second flow rate based on a second number of containers in the group including the new container acquired from a detection result of the detectors of the plurality of mounts.

2. The purge stocker according to claim 1, wherein
the nozzle includes a lid that closes the flow path due to a pressure of the purge gas in a state in which the container is not placed on the mount; and
the lid releases the flow path due to a weight of the container when the container is placed on the mount.

3. A method for feeding a purging gas for a purge stocker for supplying a purge gas to containers placed on a plurality of mounts grouped in a horizontal direction, the method comprising:
opening a flow path to supply a purge gas to a container when the container is placed on a corresponding one of the plurality of grouped mounts; and
adjusting, by each of a plurality of flow rate controllers arranged collectively on an end side of a traveling range of a conveyor that is capable of traveling along the mounts and that transfers the containers to the mounts, a flow rate of the purge gas supplied into a group based on a number of containers in the group; wherein each of the plurality of mounts includes a detector that detects whether the corresponding container is placed thereon;

a flow rate controller for the group among the plurality of flow rate controllers sets the flow rate of the purge gas supplied into the group to a first flow rate based on a first number of containers in the group acquired from a detection result of the detectors of the plurality of mounts; and when a new container is placed in the group, the flow rate controller for the group temporarily reduces the flow rate of the purge gas supplied into the group from the first flow rate and gradually increases the flow rate to a second flow rate based on a second number of containers in the group including the new container acquired from a detection result of the detectors of the plurality of mounts.

* * * * *